US009219486B2

(12) United States Patent
Raj et al.

(10) Patent No.: US 9,219,486 B2
(45) Date of Patent: Dec. 22, 2015

(54) QUADRATURE-BASED INJECTION LOCKING OF RING OSCILLATORS

(71) Applicant: California Institute of Technology, Pasadena, CA (US)

(72) Inventors: Mayank Raj, Pasadena, CA (US); Azita Emami, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 14/479,269

(22) Filed: Sep. 5, 2014

(65) Prior Publication Data

US 2015/0137895 A1    May 21, 2015

Related U.S. Application Data

(60) Provisional application No. 61/905,660, filed on Nov. 18, 2013.

(51) Int. Cl.
*H03B 27/00* (2006.01)
*H03K 3/03* (2006.01)
*H03L 7/099* (2006.01)

(52) U.S. Cl.
CPC .............. *H03L 7/0995* (2013.01); *H03B 27/00* (2013.01); *H03K 3/0315* (2013.01); *H03B 2201/038* (2013.01)

(58) Field of Classification Search
CPC ............. H03B 27/00; H03B 2201/038; H03K 3/0315; H03K 3/0322; H03L 7/0995
USPC ..................... 331/45, 57, 185, 186
See application file for complete search history.

(56) References Cited

U.S. PATENT DOCUMENTS

| 4,641,048 | A  | * | 2/1987  | Pollock ............... 327/262 |
| 5,786,715 | A  | * | 7/1998  | Halepete ............. 327/116 |
| 6,249,192 | B1 |   | 6/2001  | Gabara et al. |
| 6,442,225 | B1 | * | 8/2002  | Huang ................. 375/376 |
| 6,560,306 | B1 | * | 5/2003  | Duffy et al. ......... 375/376 |
| 6,617,934 | B1 | * | 9/2003  | Holberg et al. ....... 331/57 |
| 6,819,728 | B2 | * | 11/2004 | Boerstler ............. 375/376 |
| 7,279,996 | B2 | * | 10/2007 | Boerstler et al. ..... 331/57 |
| 8,004,306 | B2 | * | 8/2011  | Takahashi et al. ... 324/762.01 |
| 8,138,843 | B2 | * | 3/2012  | Straayer et al. ..... 331/57 |
| 8,841,948 | B1 |   | 9/2014  | Chien et al. |
| 8,854,091 | B2 | * | 10/2014 | Hossain et al. ..... 327/116 |

(Continued)

OTHER PUBLICATIONS

International Search Report and Written Opinion for International Application No. PCT/US14/62227, mailed on Jan. 22, 2015.

(Continued)

*Primary Examiner* — Levi Gannon
(74) *Attorney, Agent, or Firm* — Turk IP Law, LLC

(57) ABSTRACT

Technologies are generally described for quadrature-based injection-locking of ring oscillators. In some examples, an external signal may be injected into a ring oscillator. Phase signals may be measured from within the ring oscillator and used to determine a mean quadrature error (MQE) that characterizes the difference in frequency between the external signal and the ring oscillator's natural frequency. A control signal may then be generated from the MQE and used to adjust the ring oscillator natural frequency to reduce the difference between the ring oscillator natural frequency and the external signal.

23 Claims, 9 Drawing Sheets

(56) References Cited

U.S. PATENT DOCUMENTS

2011/0050296 A1 3/2011 Fagg
2014/0266476 A1* 9/2014 Kuo .................. 331/57

OTHER PUBLICATIONS

Betancourt-Zamora, R.J., "Injection-locked ring oscillator frequency dividers," The Department of Electrical Engineering and The Committee on Graduate Studies of Stanford University, pp. 1-128 (Mar. 2005).

Kinget, P., et al., "An Injection Locking Scheme for Precision Quadrature Generation," IEEE Journal of Solid-State Circuits, vol. 37, No. 7, pp. 845-851 (2002).

* cited by examiner

COMPUTER PROGRAM PRODUCT 900

SIGNAL-BEARING MEDIUM 902

904 AT LEAST ONE OF

ONE OR MORE INSTRUCTIONS TO INJECT AN EXTERNAL SIGNAL WITH FREQUENCY $F_{INJ}$ INTO A RING OSCILLATOR WITH NATURAL FREQUENCY $F_0$;

ONE OR MORE INSTRUCTIONS TO MEASURE PHASE SIGNALS RESULTING FROM THE COUPLING OF $F_{INJ}$ AND $F_0$ FROM MULTIPLE INVERTERS IN THE RING OSCILLATOR;

ONE OR MORE INSTRUCTIONS TO DETERMINE MEAN QUADRATURE ERROR (MQE) FROM THE MEASURED PHASE SIGNALS;

ONE OR MORE INSTRUCTIONS TO GENERATE A CONTROL SIGNAL FROM THE DETERMINED MQE; AND

ONE OR MORE INSTRUCTIONS TO ADJUST THE SUPPLY VOLTAGE(S) OF INVERTERS IN THE RING OSCILLATOR BASED ON THE GENERATED CONTROL SIGNAL.

| COMPUTER-READABLE MEDIUM 906 | RECORDABLE MEDIUM 907 | COMMUNICATIONS MEDIUM 910 |

QUADRATURE-BASED INJECTION LOCKING OF RING OSCILLATORS

CROSS-REFERENCE TO RELATED APPLICATION

This Application claims priority under 35 U.S.C. §119(e) to U.S. Provisional Patent Application Ser. No. 61/905,660 filed on Nov. 18, 2013, entitled "Quadrature Locked Loop (QLL)". The disclosure of the U.S. Provisional Patent Application is hereby incorporated by reference for all purposes.

BACKGROUND

Unless otherwise indicated herein, the materials described in this section are not prior art to the claims in this application and are not admitted to be prior art by inclusion in this section.

Ring oscillators may include inverter-based circuits that may be used to generate clock signals for other circuit blocks. A ring oscillator may be implemented using an odd number of inverters coupled in series, with the output terminal of the last inverter coupled to the input terminal of the first inverter. An inverter outputs a signal that is opposite in sign to its input, and may do so for a finite period of time after the input is applied. Accordingly, the output of an inverter in a ring oscillator may switch signs with a particular frequency, thereby providing a clock signal suitable for other circuit blocks.

SUMMARY

The present disclosure generally describes techniques to injection-lock ring oscillators.

According to some examples, methods are described to injection-lock a ring oscillator having multiple inverters and a natural frequency. Example methods may include injecting an external signal with an injection frequency into the multiple inverters, detecting a first phase signal, formed from a coupling of the natural frequency and the injection frequency, from a first inverter in the multiple inverters. The methods may also include detecting a second phase signal, formed from the coupling of the natural frequency and the injection frequency, from a second inverter in the multiple inverters, determining a mean quadrature error (MQE) from at least the first phase signal and the second phase signal. The methods may further include generating a control signal from the determined MQE and adjusting the natural frequency of the ring oscillator based on the control signal.

According to other examples, injection-locked ring-oscillator systems are described. Example systems may include multiple inverters, a phase detector module coupled to the multiple inverters, and a control module coupled to the phase detector module. The inverters may be configured to receive an external signal with an injection frequency and to output an oscillation signal. The phase detector module may be configured to detect a first phase signal, formed from a coupling of a natural frequency of the system and the injection frequency, from a first inverter in the multiple inverters and to detect a second phase signal, formed from the coupling of the natural frequency of the system and the injection frequency from a second inverter in the multiple inverters. The phase detector module may also be configured to determine a mean quadrature error (MQE) from at least the first phase signal and the second phase signal. The control module may be configured to generate a control signal from the determined MQE and adjust a supply voltage to at least one of the multiple inverters based on the control signal.

According to further examples, a clock signal distribution circuit is provided. The circuit may include a clock signal injection state, a ring oscillator with a natural frequency and coupled to the clock signal injection stage, a quadrature phase detector module coupled to the ring oscillator, and a low-pass filter module coupled to the ring oscillator and the quadrature phase detector module. The clock signal injection stage may be configured to receive a clock signal and use the clock signal to output an injection signal with an injection frequency. The ring oscillator may be configured to receive the injection signal and output multiple oscillation signals. The quadrature phase detector module may be configured to detect, from the ring oscillator, multiple phase signals formed from the coupling of the natural frequency and the injection frequency, and determine a mean quadrature error (MQE) from the multiple phase signals. The low-pass filter module may be configured to generate a control signal from the determined MQE and provide the control signal to the ring oscillator.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 9 illustrates a block diagram of an example computer program product, all arranged in accordance with at least some embodiments described herein.

DETAILED DESCRIPTION

Figure 1:
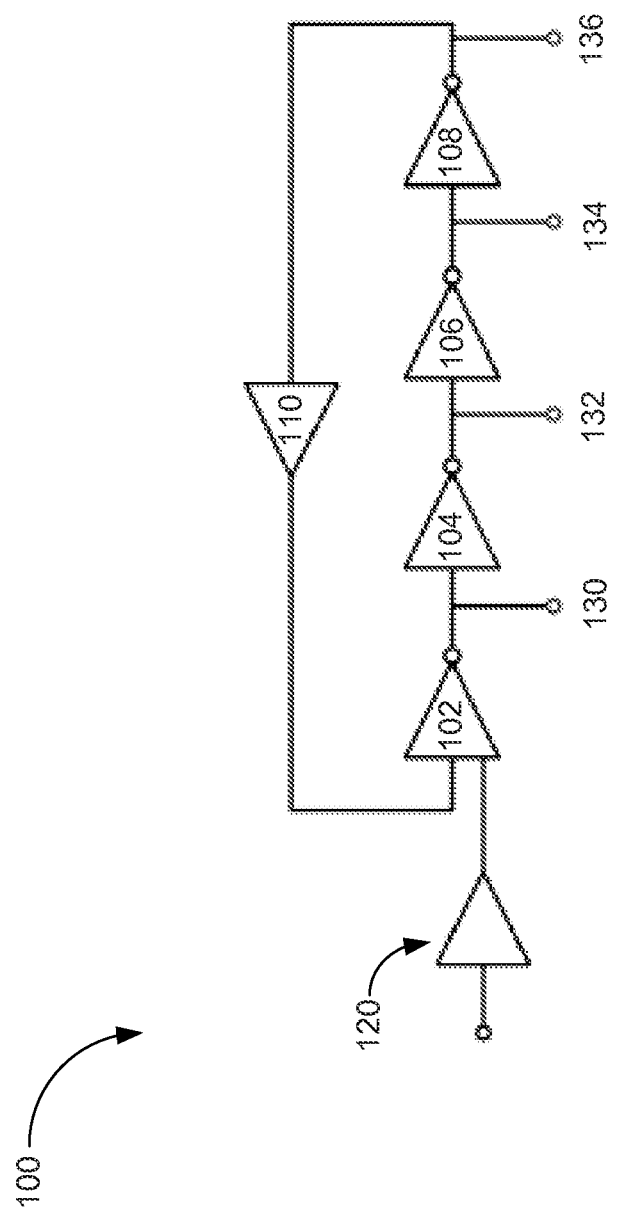
FIG. 1 illustrates an example ring oscillator.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems, devices, and/or computer program products related to quadrature-based injection-locking of ring oscillators.

Briefly stated, technologies are generally described for quadrature-based injection-locking of ring oscillators. In some examples, an external signal may be injected into a ring oscillator. Phase signals may be measured from within the ring oscillator and used to determine a mean quadrature error (MQE) that characterizes a difference in frequency between the external signal and the ring oscillator's natural frequency. A control signal may then be generated from the MQE and used to adjust the ring oscillator natural frequency to reduce the difference between the ring oscillator natural frequency and the external signal.

FIG. 1 illustrates an example ring oscillator 100, arranged in accordance with at least some embodiments described herein.

The ring oscillator 100 may include inverters 102, 104, 106, and 108, with an additional inverter stage 110. The ring oscillator 100 may be configured to output a number of output oscillation signals 130, 132, 134, and 136, which oscillate and which correspond to the outputs of the inverters 102, 104, 106, and 108, respectively. The ring oscillator 100 may also include an external signal 120 (provided via one or more signal sources) that may be injected into the ring oscillator 100 as an input to the inverter 102.

As described above, a ring oscillator may be implemented with an odd number of inverter stages coupled in series. For example, the inverters 102, 104, 106, and 108 may be coupled in series, with the output terminal of each inverter coupled to the input terminal of another inverter. The inverter stage 110 may be implemented as an inverter or may be implemented by some other circuit configured to invert an input signal. In some embodiments, the inverter stage 110 may be configured to operate significantly faster than the inverters 102-108 so as to reduce its effect on the oscillation timing of the ring oscillator 100. During operation of the ring oscillator 100, the output oscillation signals 130-136 output from the inverters 102-108 may oscillate at the same frequency but differ in phase. For example, the output signal 132 may oscillate at the same frequency as the output signal 130, but have a phase that lags the phase of the output signal 130 due to signal delay from the inverter 104. In the absence of external signals, the output oscillation signals 130-136 may oscillate at a natural frequency of the ring oscillator 100, which may be based on the structure of the inverters 102-110 and the power (in terms of voltage and/or current) supplied to the inverters 102-110 and/or based on some other factor(s) or combination(s) thereof.

While the ring oscillator 100 is depicted as including five inverter stages, in other embodiments, a ring oscillator may include more inverter stages or fewer inverter stages. The number of inverter stages may be selected based on a target natural frequency of the ring oscillator, a target number of potential output oscillation signals, or any other suitable criteria.

In some embodiments, the ring oscillator 100 may be used to provide output signals that are synchronized to an external signal. For example, the external signal 120 may be a clock signal, and the ring oscillator 100 may attempt to synchronize the output oscillation signals 130-136 to the frequency of the external signal 120. As a result, the output oscillation signals 130-136 may oscillate at the frequency of the external signal 120. However, if the frequency of the external signal 120 does not match the natural frequency of the ring oscillator 100, then phase errors may arise in the output oscillation signals 130-136. In some embodiments, quadrature-based injection locking may be used to reduce the phase errors in ring oscillator output signals by reducing the difference between the frequency of an external signal and the natural frequency of the ring oscillator.

Figure 2:
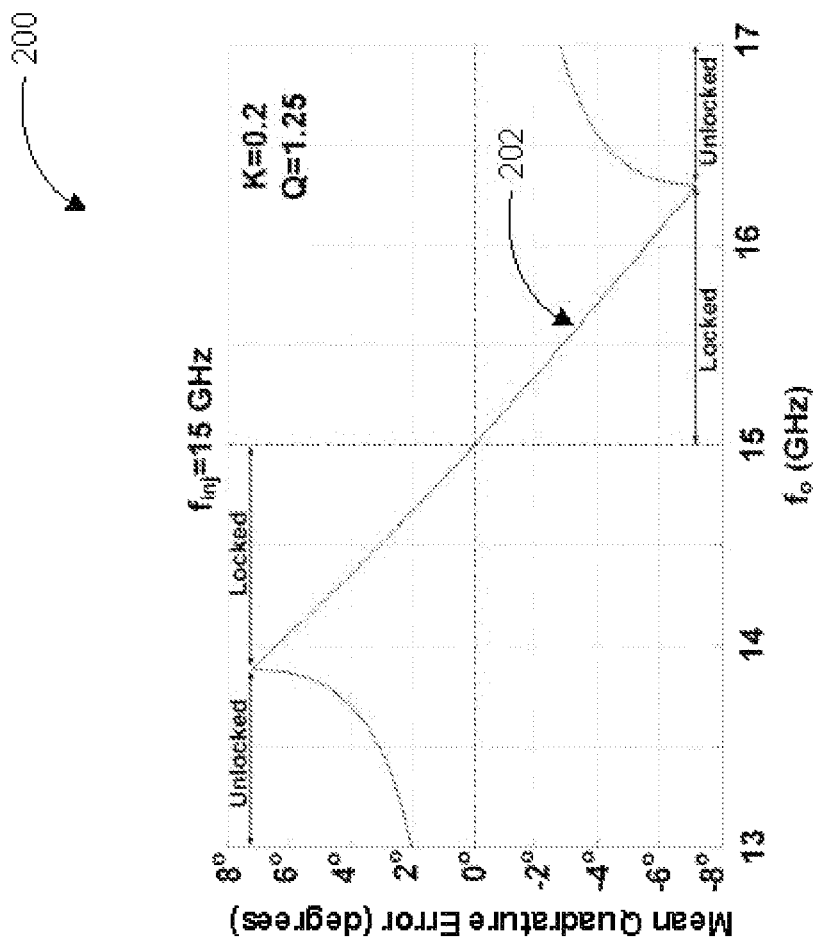
FIG. 2 illustrates a diagram of an example of mean quadrature error versus frequency difference in a ring oscillator system.

FIG. 2 illustrates a diagram of an example of mean quadrature error versus frequency difference in a ring oscillator system, arranged in accordance with at least some embodiments described herein.

As shown in the diagram 200, a mean quadrature error (MQE) curve 202 may vary based on the difference between the natural frequency of a ring oscillator (denoted by $f_0$) and the frequency of an externally injected signal (denoted by $f_{inj}$). In some embodiments, the MQE may be the average quadrature phase error (for example, the phase difference between two signals that are nominally offset by 90° in phase), and may be determined by:

$$MQE = \frac{\pi}{2}\left(\frac{\omega_{inj}}{\omega_0} + \frac{\omega_b}{\omega_0} - 1\right)$$

where $$\omega_b = \sqrt{(\omega_0 - \omega_{inj})^2 - \omega_l^2}$$

$$\omega_l = \frac{\omega_0}{2Q}k$$

$$\omega_{inj} = 2\pi f_{inj}, \text{ and } \omega_0 = 2\pi f_0.$$

As shown by the MQE curve 202, the magnitude (for example, absolute value) of the MQE may vary according to the difference between $f_0$ and $f_{inj}$ during the locked state, (for example, when $(\omega_0-\omega_{inj})^2 < \omega_l^2$). For example, as $f_0$ grows larger than $f_{inj}$ in the locked state, the MQE may become more and more negative (for example, larger in absolute value while remaining negative). Similarly, as $f_0$ becomes smaller than $f_{inj}$ in the locked state, the MQE may become more and more positive (for example, larger in absolute value while remaining positive). Accordingly, the magnitude and sign of a measured MQE value may be used to match $f_0$ to $f_{inj}$. For example, $f_0$ may be reduced in response to determining that the measured MQE value is negative and the system is locked. Similarly, $f_0$ may be increased in response to determining that the measured MQE value is positive and the system is locked. In either case, the adjustment of $f_0$ may continue until the measured MQE value is substantially zero (for example, until $f_0$ substantially equals $f_{inj}$), thereby reducing phase error in the outputs of the ring oscillator. In situations where a ring oscillator system begins in the unlocked state, where $(\omega_0-\omega_{inj})^2 \geq \omega_l^2$, the natural frequency $f_0$ and/or the injection frequency $f_{inj}$ may be adjusted via other suitable technique until the system is locked.

Figure 3:
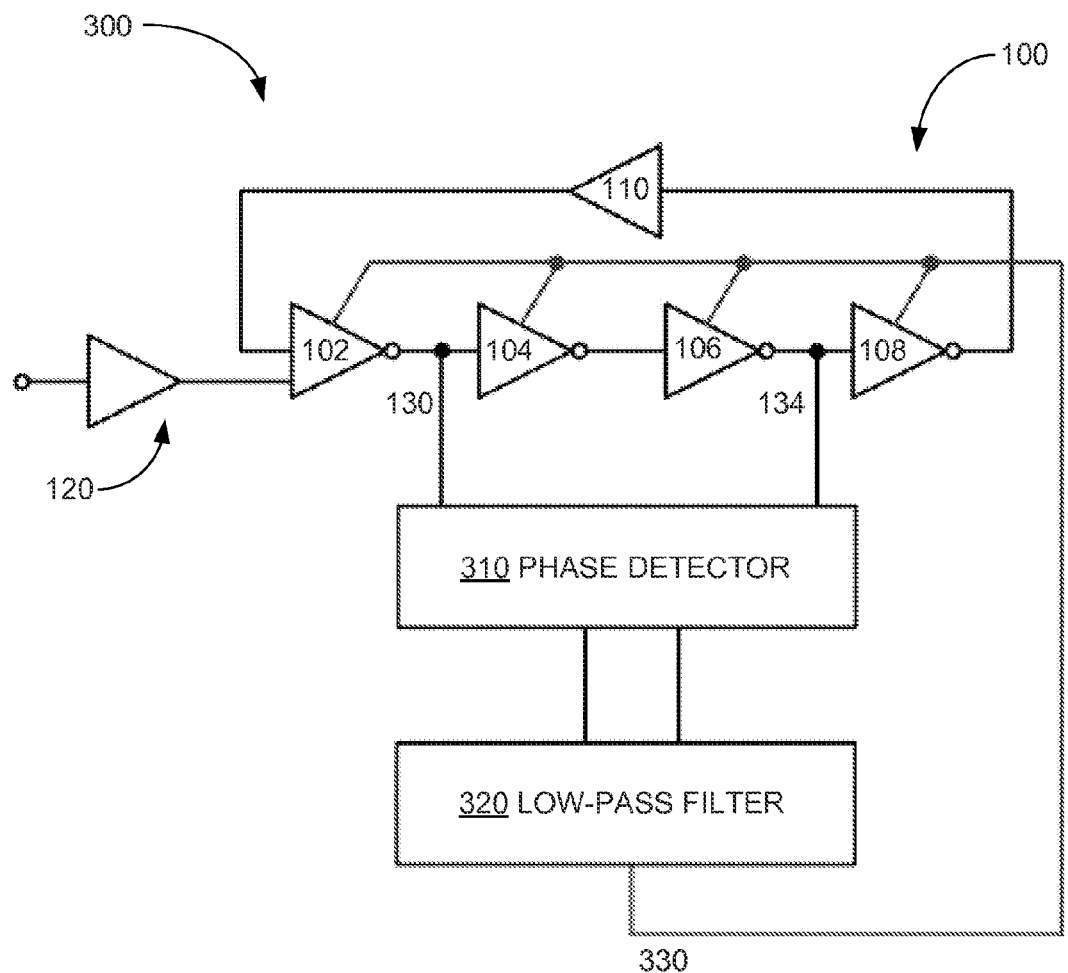
FIG. 3 illustrates an example ring oscillator system that may implement quadrature-based injection locking.

FIG. 3 illustrates an example ring oscillator system that may implement quadrature-based injection locking, arranged in accordance with at least some embodiments described herein.

As depicted in a ring oscillator system 300, the ring oscillator 100, which may be arranged to provide quadrature output oscillation signals, may be coupled to a phase detector 310, which in turn may be coupled to a low-pass filter 320 that may output a control signal 330. The phase detector 310 may be configured to determine the MQE as described above. The phase detector 310 may be coupled to receive two quadrature output oscillation signals that are nominally offset by 90° in phase. For example, the phase detector 310 may be coupled to the output terminals of the inverters 102 and 106 so as to receive output oscillation signals 130 and 134, respectively originating from the inverters 102 and 106, which may be separated by the inverter 104. In some embodiments, the phase detector 310 may instead be coupled to the output terminals of the inverters 104 and 108, respectively corresponding to the output oscillation signals 132 and 136.

The phase detector 310 may in turn be configured to output the determined MQE to the low-pass filter 320. The low-pass filter 320 may be configured to reduce or remove high-frequency variations in the MQE received from the phase detector 310 and output a relatively low-frequency signal that may be proportional (for example) to the difference between the phases of the output oscillation signals 130 and 134. The low-frequency signal output by the low-pass filter 320 may then be used as the control signal 330 to adjust the natural frequency $f_0$ of the ring oscillator 100 to reduce the magnitude of the determined MQE (which may be representative of the frequency difference between $f_0$ and $f_{inj}$).

In some embodiments, the control signal 330 may be directly used as the supply voltage for the inverters 102-108 of the ring oscillator 100. For example, in response to the determination of a positive MQE (for example, $f_0 < f_{inj}$) by the phase detector 310, the low-pass filter 320 may increase the magnitude of the control signal 330 and therefore increase the supply voltage to the inverters 102-108. The increase in supply voltage may result in an increase in operating speed for the inverters 102-108, causing the ring oscillator 100 to oscillate faster and thereby increase $f_0$. As another example, in response to the determination of a negative MQE (for example, $f_0 > f_{inj}$) by the phase detector 310, the low-pass filter 320 may decrease the magnitude of the control signal 330 and therefore decrease the supply voltage to the inverters 102-108. The decrease in supply voltage may result in a decrease in operating speed for the inverters 102-108, causing the ring oscillator 100 to oscillate slower and thereby decrease $f_0$. In either case, as $f_0$ approaches $f_{inj}$, the magnitude of the determined MQE may decrease until $f_0$ substantially matches $f_{inj}$.

Figure 4:
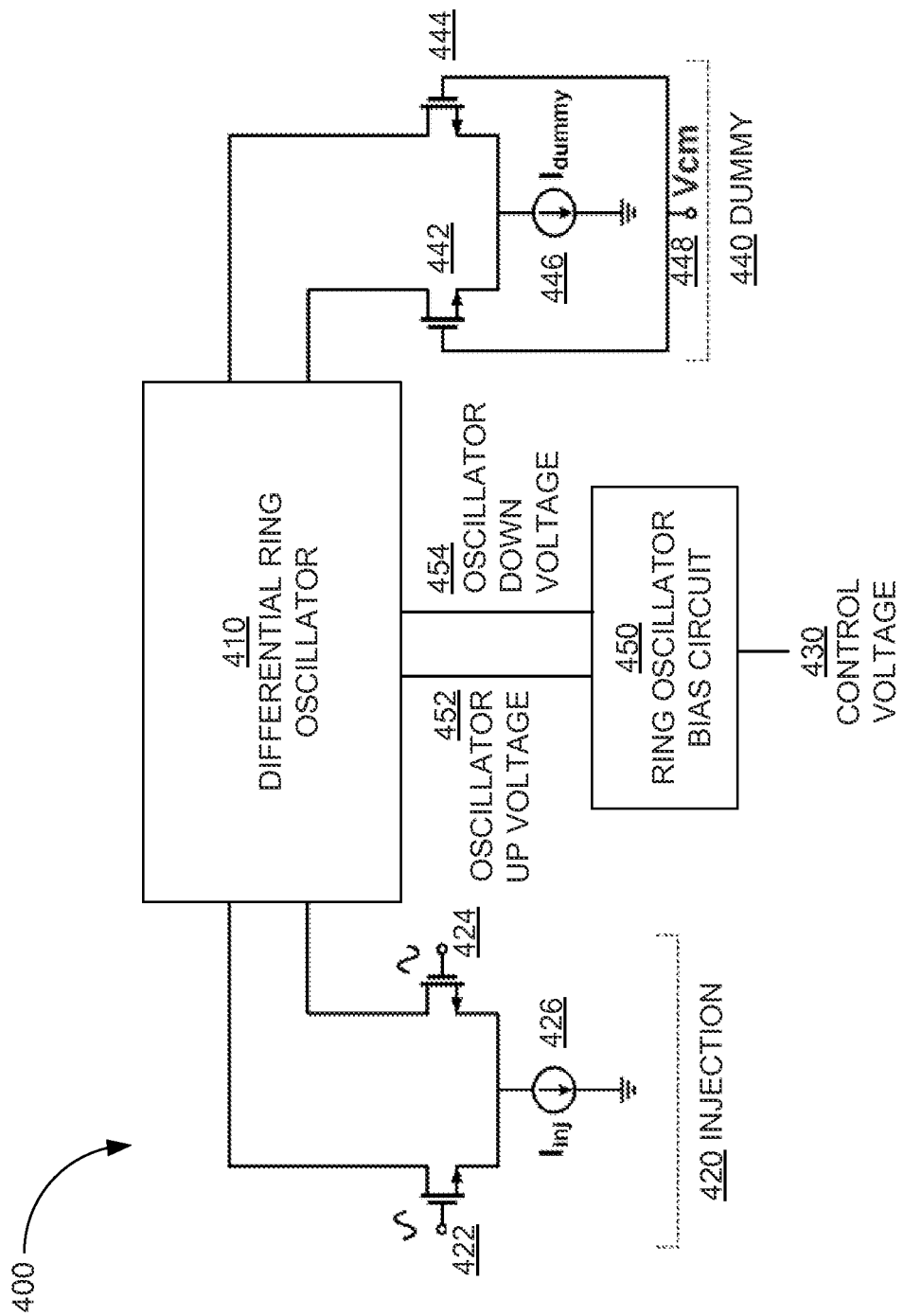
FIG. 4 illustrates a detailed diagram of an example ring oscillator system that may be controlled using quadrature-based injection locking.

FIG. 4 illustrates a detailed diagram of an example ring oscillator system that may be controlled using quadrature-based injection locking, arranged in accordance with at least some embodiments described herein.

In some embodiments, a ring oscillator system 400 may be implemented as a differential system to improve noise rejection. The ring oscillator system 400 may include an injection section 420 and a dummy section 440, both coupled to a differential ring oscillator 410. The injection section 420 may include a transistor 422 and a transistor 424, both coupled to an injection current source 426. The dummy section 440 may include a transistor 442 and a transistor 444, both coupled to a dummy current source 446 and having gates coupled to a common mode voltage 448. The ring oscillator system 400 may further include a ring oscillator bias circuit 450 coupled to the differential ring oscillator 410 and configured to receive a control voltage 430 and provide power to the inverters in the differential ring oscillator 410 in the form of an oscillator up voltage 452 and an oscillator down voltage 454.

In some embodiments, the differential ring oscillator 410 may include a number of inverters arranged to maintain and propagate an oscillation signal, along with the dummy section 440. The injection section 420 may be configured to receive an external signal (for example, the external signal 120), which may be represented as the injection current source 426 and voltages at the gates of the transistors 422 and 424, and may inject the external signal into the differential ring oscillator 410. The dummy section 440 may be configured to provide a common-mode signal to the differential ring oscillator 410 via the transistors 442 and 444 for differential operation. The ring oscillator bias circuit 450 may be configured to adjust the oscillator up voltage 452 and the oscillator down voltage 454 provided to the inverters in the differential ring oscillator 410 based on the control voltage 430 (for example, the control signal 330).

Figure 5:
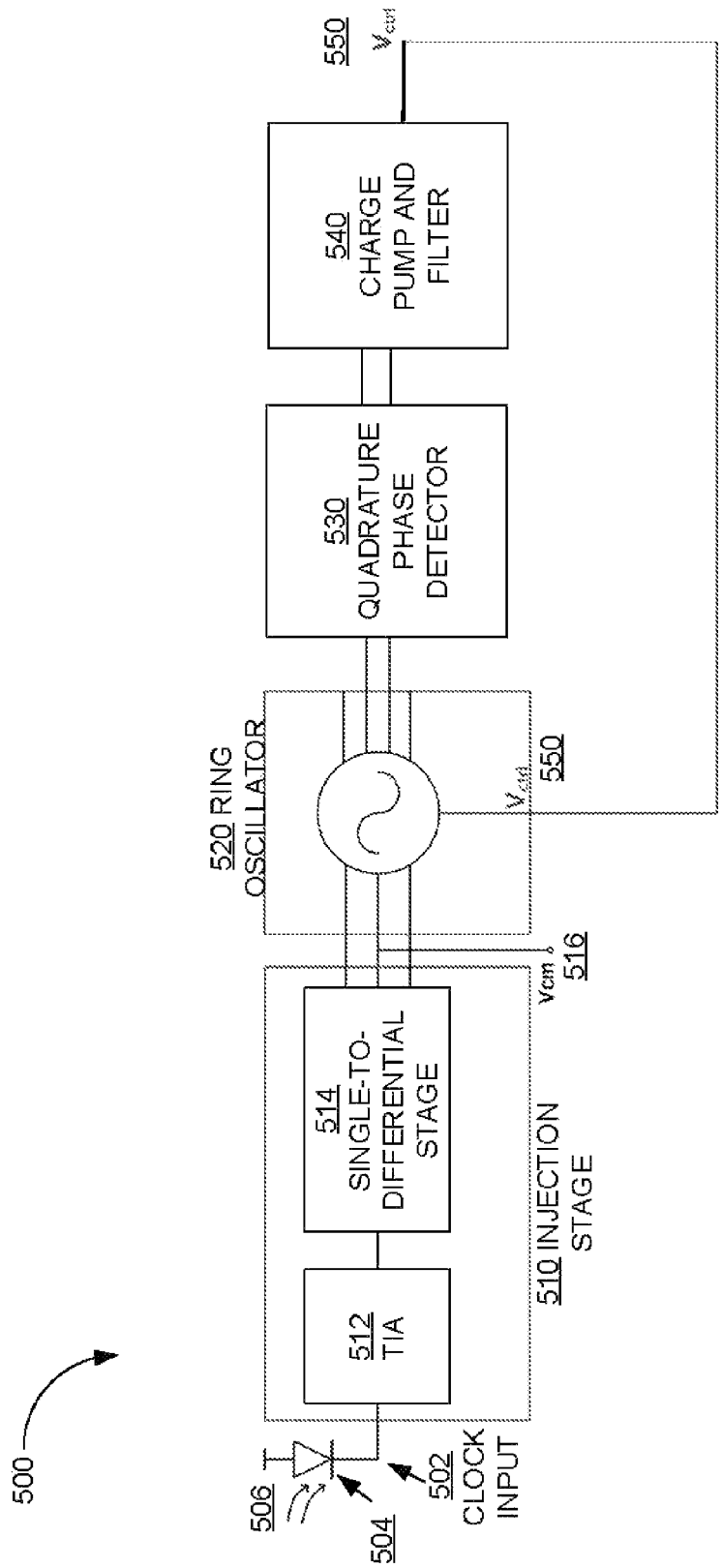
FIG. 5 illustrates a detailed diagram of an example ring oscillator system that may implement quadrature-based injection locking.

FIG. 5 illustrates a detailed diagram of an example ring oscillator system that may implement quadrature-based injection locking, arranged in accordance with at least some embodiments described herein.

As depicted in a ring oscillator system 500, a differential ring oscillator 520 (similar to the differential ring oscillator 410) may receive a differential external signal from a differential injection stage 510 coupled to a clock input 502. The clock input 502 may include a photodiode 504 configured to receive an optical clock signal 506. The injection stage 510 may include a transimpedance amplifier 512 coupled to a single-to-differential stage 514, and one of the output terminals of the injection stage 510 may be coupled to a common mode voltage 516. A differential quadrature phase detector 530 (similar to the phase detector 310) coupled to the differential ring oscillator 520 may measure quadrature output oscillation signals from the differential ring oscillator 520 and determine an MQE from the measured signals. The quadrature phase detector 530 may then send the MQE to a differential charge pump and filter 540, which may be implemented as a low-pass filter (similar to the low-pass filter 320).

In some embodiments, the clock input 502 may be configured to convert the optical clock signal 506 into an electrical clock signal using the photodiode 504. The clock input 502 may then provide the electrical clock signal to the injection stage 510 as an injection signal to be injected into the differential ring oscillator 520 (for example, the external signal 120). In some embodiments, the clock input 502 may provide the electrical clock signal as a time-varying current signal. The transimpedance amplifier 512 in the differential injection stage 510 may first convert the injection signal into an amplified time-varying voltage injection signal. The single-to-differential stage 514 may then convert the voltage injection signal into a differential signal suitable for the differential ring oscillator 520, then inject the differential injection signal into the differential ring oscillator 520.

The differential quadrature phase detector 530 may measure the phases of two quadrature oscillation signals output by the differential ring oscillator 520 and convert the measured phases into the MQE, as described above. The differential charge pump and filter 540, which may implement a low-pass filter using a charge pump, may then receive the MQE and generate a control signal $V_{ctrl}$ 550 from the MQE by, for example, reducing the magnitude of high-frequency components of the MQE while maintaining the magnitude of low-frequency components of the MQE. The control signal $V_{ctrl}$ 550 may then be used to adjust the supply voltage of the differential ring oscillator 520, for example, via a bias circuit such as the ring oscillator bias circuit 450.

Figure 6:
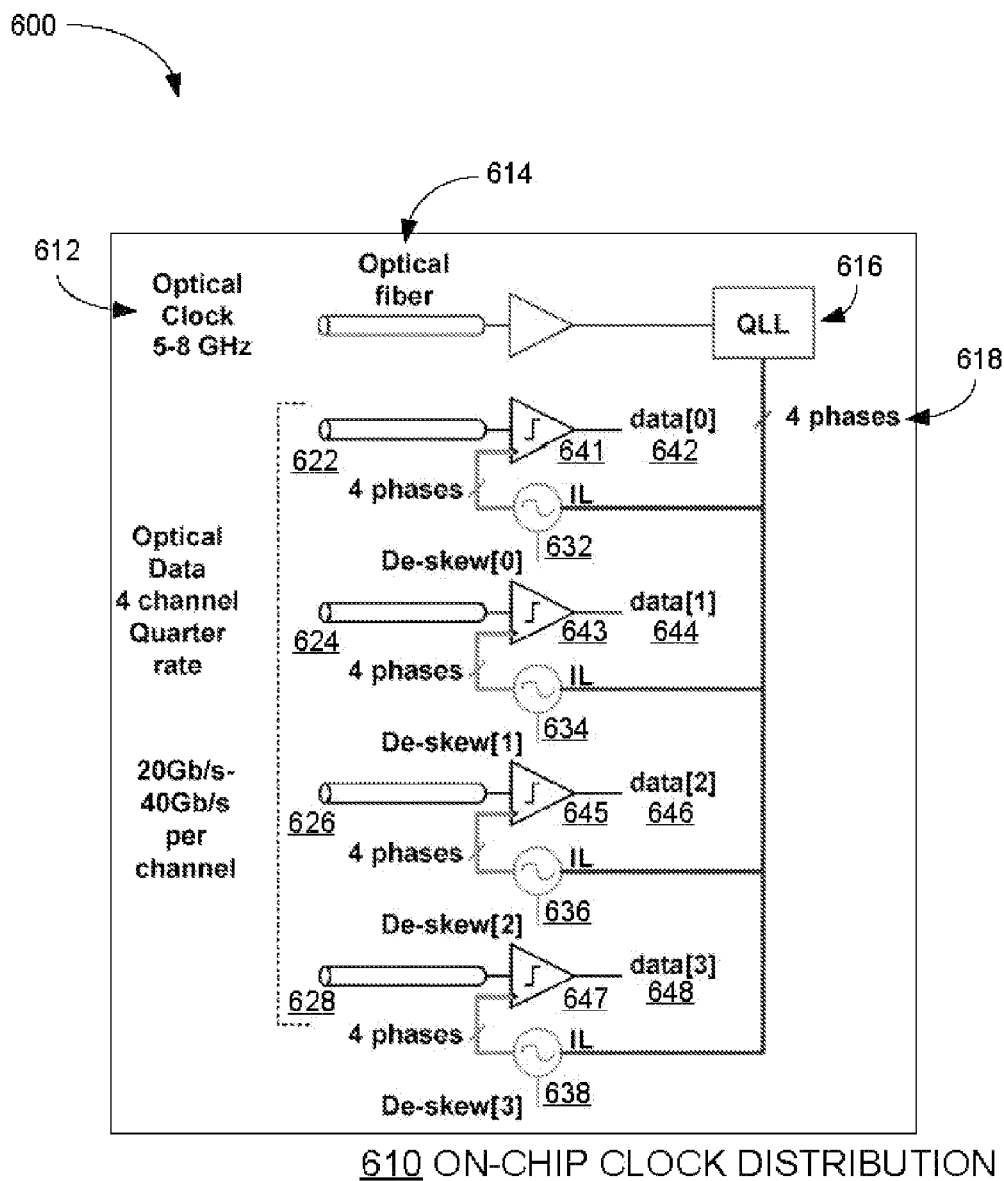
FIG. 6 illustrates an example on-chip clock distribution system that may use quadrature-based injection locking.

FIG. 6 illustrates an example on-chip clock distribution system that may use quadrature-based injection locking, arranged in accordance with at least some embodiments described herein.

According to a diagram 600, an on-chip clock distribution system 610 may include a quadrature-based injection-locked ring oscillator system 616 coupled to receive an optical clock signal 612 through an optical fiber 614. The ring oscillator system 616 may convert the optical clock signal 612 into an electrical clock signal using, for example, an injection stage similar to the injection stage 510. The ring oscillator system 616 may then perform injection locking based on mean quadrature error as described above and output four quadrature output oscillation signals 618 (for example, the output oscillation signals 130-136), each signal offset from the other signals by at least 90° in phase. The signals 618 may then be used to process incoming data. For example the signals 618 may first be de-skewed to provide synchronization at de-skew stages 632, 634, 636, and 638. The de-skewed signals may then be used to recover data 642, 644, 646, and 648 from modulated/encoded data signals 622, 624, 626, and 628 at data recovery stages 641, 643, 645, and 647, respectively.

Figure 7:
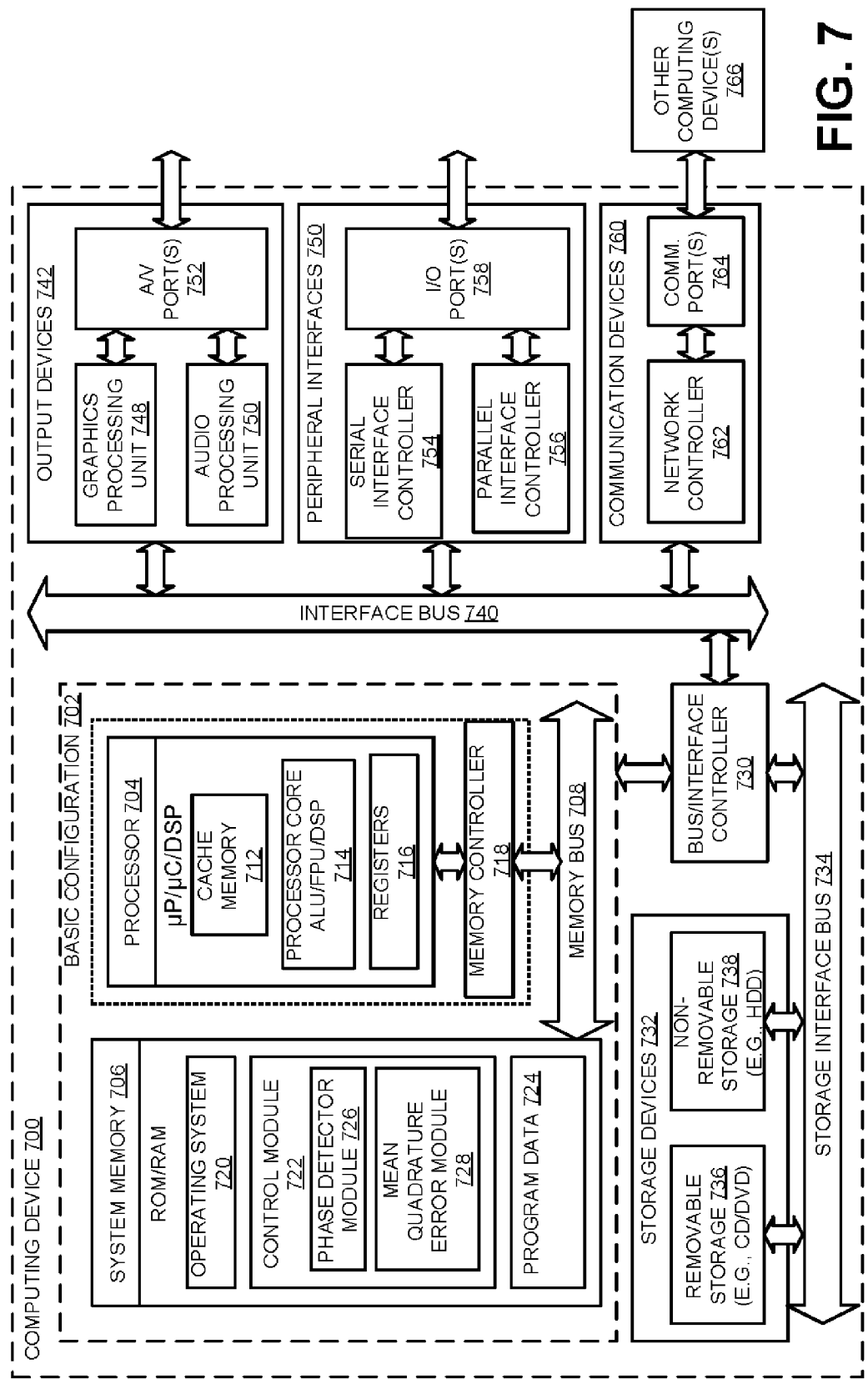
FIG. 7 illustrates a general purpose computing device that could be used in conjunction with a ring oscillator that implements quadrature-based injection-locking.

FIG. 7 illustrates a general purpose computing device that could be used in conjunction with a ring oscillator that implements quadrature-based injection-locking, arranged in accordance with at least some embodiments described herein.

For example, the computing device 700 may be used to implement quadrature-based injection locking of ring oscillators as described herein, in one or more components of the computing device 700 that operate with clock signals. Alternatively or additionally, the computing device 700 may be used to control the operation of ring oscillators so as to implement quadrature-based injection locking, wherein such ring oscillators may be located within or external to the computing device 700. In an example basic configuration 702, the computing device 700 may include one or more processors 704 and a system memory 706. A memory bus 708 may be used to communicate between the processor 704 and the system memory 706. The basic configuration 702 is illustrated in FIG. 7 by those components within the inner dashed line.

Depending on the desired configuration, the processor 704 may be of any type, including but not limited to a microprocessor (µP), a microcontroller (µC), a digital signal processor (DSP), or any combination thereof. The processor 704 may include one more levels of caching, such as a cache memory 712, a processor core 714, and registers 716. The example processor core 714 may include an arithmetic logic unit (ALU), a floating point unit (FPU), a digital signal processing core (DSP Core), or any combination thereof. An example memory controller 718 may also be used with the processor 704, or in some implementations the memory controller 718 may be an internal part of the processor 704.

Depending on the desired configuration, the system memory 706 may be of any type including but not limited to volatile memory (such as RAM), non-volatile memory (such as ROM, flash memory, etc.) or any combination thereof. The system memory 706 may include an operating system 720, a control module 722, and program data 724. The control module 722 may include a phase detector module 726 and a mean quadrature error module 728 to implement or otherwise control operations associated with quadrature-based ring oscillator injection locking as described herein.

The computing device 700 may have additional features or functionality, and additional interfaces to facilitate communications between the basic configuration 702 and any desired devices and interfaces. For example, a bus/interface controller 730 may be used to facilitate communications between the basic configuration 702 and one or more data storage devices 732 via a storage interface bus 734. The data storage devices 732 may be one or more removable storage devices 736, one or more non-removable storage devices 738, or a combination thereof. Examples of the removable storage and the non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and non-volatile, removable and non-removable media implemented in any method or technology for storage of information, such as computer readable instructions, data structures, program modules, or other data.

The system memory 706, the removable storage devices 736 and the non-removable storage devices 738 are examples of computer storage media. Computer storage media includes, but is not limited to, RAM, ROM, EEPROM, flash memory or other memory technology, CD-ROM, digital versatile disks (DVDs), solid state drives, or other optical storage, magnetic cassettes, magnetic tape, magnetic disk storage or other magnetic storage devices, or any other medium which may be used to store the desired information and which may be accessed by the computing device 700. Any such computer storage media may be part of the computing device 700.

The computing device 700 may also include an interface bus 740 for facilitating communication from various interface devices (e.g., one or more output devices 742, one or more peripheral interfaces 744, and one or more communication devices 766) to the basic configuration 702 via the bus/interface controller 730. Some of the example output devices 742 include a graphics processing unit 748 and an audio processing unit 750, which may be configured to communicate to various external devices such as a display or speakers via one or more A/V ports 752. One or more example peripheral interfaces 744 may include a serial interface controller 754 or a parallel interface controller 756, which may be configured to communicate with external devices such as input devices (e.g., keyboard, mouse, pen, voice input device, touch input device, etc.) or other peripheral devices (e.g., printer, scanner, etc.) via one or more I/O ports 758. An example communication device 766 includes a network controller 760, which may be arranged to facilitate communications with one or more other computing devices 762 over a network communication link via one or more communication ports 764.

The network communication link may be one example of a communication media. Communication media may be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 700 may be implemented as a part of a general purpose or specialized server, mainframe, or similar computer that includes any of the above functions or features. The computing device 700 may also be implemented as a personal computer including both laptop computer and non-laptop computer configurations.

Figure 8:
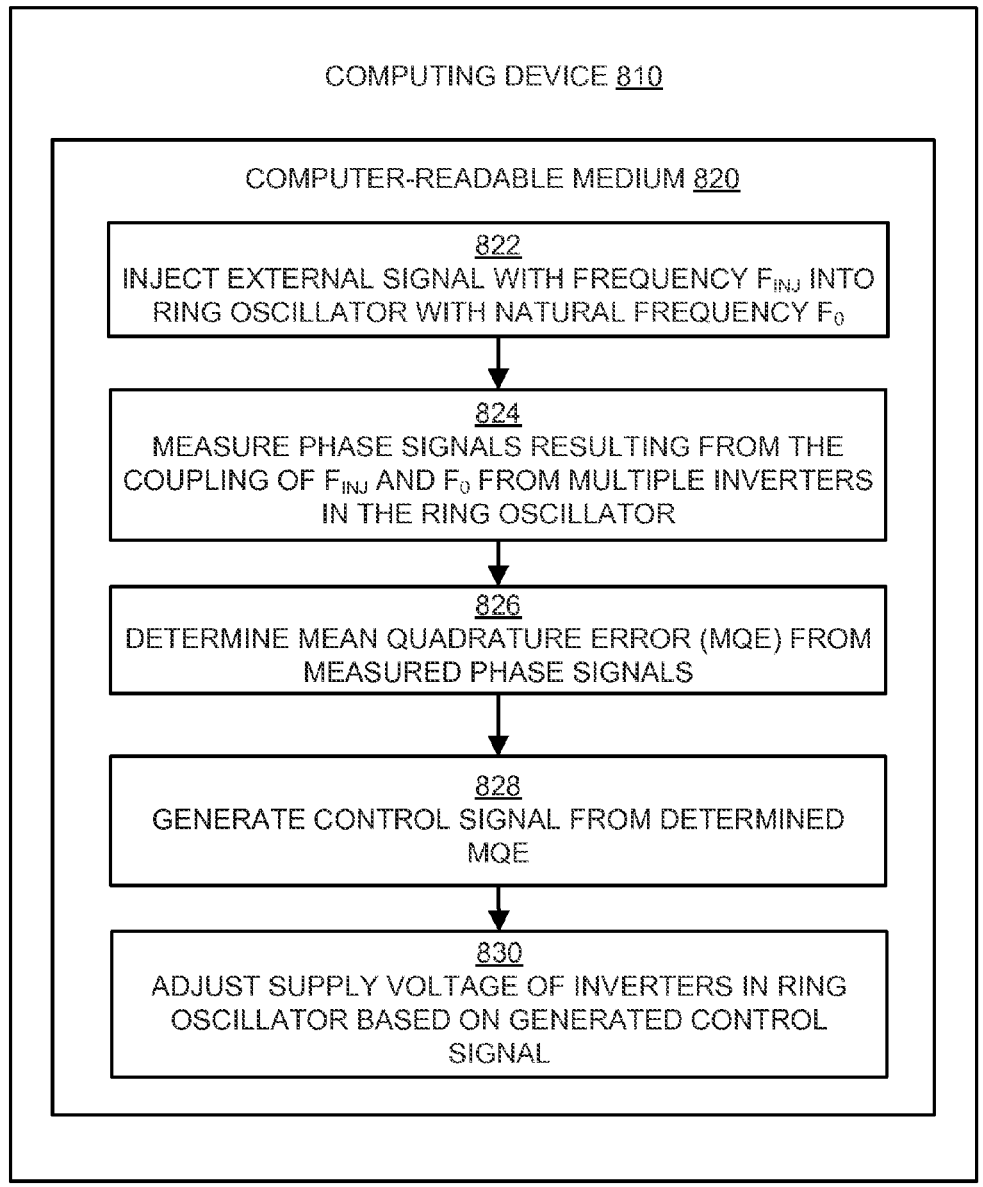
FIG. 8 is a flow diagram illustrating an example method to perform quadrature-based injection-locking of a ring oscillator that may be performed by a computing device such as the computing device in FIG. 7.

FIG. 8 is a flow diagram illustrating an example method to perform quadrature-based injection-locking of a ring oscillator that may be performed by a computing device such as the computing device in FIG. 7, arranged in accordance with at least some embodiments described herein.

Example methods may include one or more operations, functions or actions as illustrated by one or more of blocks 822, 824, 826, 828, and/or 830, and may in some embodiments be performed (or otherwise controlled) by and/or in a computing device such as the computing device 800 in FIG. 8. The operations described in the blocks 822-830 may also be stored as computer-executable instructions in a computer-readable medium such as a computer-readable medium 820 of a computing device 810.

An example process for implementing quadrature-based injection locking of ring oscillators may begin with block 822, "INJECT EXTERNAL SIGNAL WITH FREQUENCY $F_{INJ}$ INTO RING OSCILLATOR WITH NATURAL FREQUENCY $F_0$", where an injection stage (for example, the injection stage 510) may inject an external signal such as a clock signal having a frequency $f_{inj}$ into a ring oscillator (for example, the ring oscillator 100) that may have a different natural frequency $f_0$, as described above.

Block 822 may be followed by block 824, "MEASURE PHASE SIGNALS RESULTING FROM THE COUPLING OF $F_{INJ}$ AND $F_0$ FROM MULTIPLE INVERTERS IN THE RING OSCILLATOR", where a phase detector module (for example, the phase detector 310) may measure the phases of quadrature signals (for example, the output oscillation signals 130 and 134) output from the ring oscillator, as described above. The frequencies and phases of the quadrature signals may result from the coupling of the external signal having the frequency $f_{inj}$ and the natural frequency $f_0$ of the ring oscillator.

Block 824 may be followed by block 826, "DETERMINE MEAN QUADRATURE ERROR (MQE) FROM MEASURED PHASE SIGNALS", where the phase detector module may determine a mean quadrature error (MQE) parameter as described above from the quadrature signal phases measured at block 824. In some embodiments, the MQE parameter may vary directly with the difference between the measured quadrature signal phases.

Block 826 may be followed by block 828, "GENERATE CONTROL SIGNAL FROM DETERMINED MQE", where a low-pass filter (for example, the low-pass filter 320) may generate a control signal (for example, the control signal 330) as described above from the MQE determined at block 826. In some embodiments, the control signal may include relatively low frequency components of the MQE, generated by passing the MQE through a low-pass filter.

Block 828 may be followed by block 830, "ADJUST SUPPLY VOLTAGE OF INVERTERS IN RING OSCILLATOR BASED ON GENERATED CONTROL SIGNAL", where the control signal may be used to adjust the supply voltage of one or more inverters (for example, the inverters 102-108) in the ring oscillator to reduce the difference between the $f_{inj}$ of the external signal and the natural frequency $f_0$ of the ring oscillator, as described above. In some embodiments, the control signal itself may be used as the supply voltage value.

FIG. 9 illustrates a block diagram of an example computer program product, arranged in accordance with at least some embodiments described herein.

In some examples, as shown in FIG. 9, a computer program product 900 may include a signal bearing medium 902 that may also include one or more machine readable instructions 904 that, in response to execution by, for example, a processor may provide the functionality and features described herein. Thus, for example, referring to the processor 704 in FIG. 7, the control module 722 may undertake one or more of the tasks shown in FIG. 9 in response to the instructions 904 conveyed to the processor 704 by the medium 902 to perform/control actions associated with quadrature-based injection locking of ring oscillators as described herein. Some of those instructions may include, for example, instructions to inject an external signal with frequency $f_{inj}$ into a ring oscillator with natural frequency $f_0$, measure phase signals resulting from the coupling of $f_{inj}$ and $f_0$ from multiple inverters in the ring oscillator, determine mean quadrature error (MQE) from the measured phase signals, generate a control signal from the determined MQE, and/or adjust the supply voltage(s) of inverters in the ring oscillator based on the generate control signal, according to some embodiments described herein.

In some implementations, the signal bearing media 902 depicted in FIG. 9 may encompass computer-readable media 906, such as, but not limited to, a hard disk drive, a solid state drive, a compact disk (CD), a digital versatile disk (DVD), a digital tape, memory, etc. In some implementations, the signal bearing media 902 may encompass recordable media 907, such as, but not limited to, memory, read/write (R/W) CDs, R/W DVDs, etc. In some implementations, the signal bearing media 902 may encompass communications media 910, such as, but not limited to, a digital and/or an analog communication medium (e.g., a fiber optic cable, a waveguide, a wired communications link, a wireless communication link, etc.). Thus, for example, the program product 900 may be conveyed to one or more modules of the processor 704 by an RF signal bearing medium, where the signal bearing media 902 is conveyed by the wireless communications media 910 (e.g., a wireless communications medium conforming with the IEEE 802.11 standard).

According to some examples, methods are described to injection-lock a ring oscillator having multiple inverters and a natural frequency. Example methods may include injecting an external signal with an injection frequency into the multiple inverters, detecting a first phase signal, formed from a coupling of the natural frequency and the injection frequency, from a first inverter in the multiple inverters. The methods may also include detecting a second phase signal, formed from the coupling of the natural frequency and the injection frequency, from a second inverter in the multiple inverters, determining a mean quadrature error (MQE) from at least the first phase signal and the second phase signal. The methods may further include generating a control signal from the determined MQE and adjusting the natural frequency of the ring oscillator based on the control signal.

According to some embodiments, injecting the external signal may include injecting the external signal into an input terminal of the first inverter. Generating the control signal may include generating the control signal from the MQE by use of a low-pass filter. Adjusting the natural frequency of the ring oscillator may include adjusting the natural frequency so as to reduce a magnitude of the MQE. Adjust the natural frequency may further include increasing the natural frequency in response to the determined MQE being greater than zero and decreasing the natural frequency in response to the determined MQE being less than zero. Adjusting the natural frequency may include adjusting the natural frequency using adjusting of a supply voltage to at least one of the multiple inverters based on the control signal. The method may further include using the control signal as the supply voltage.

According to other examples, injection-locked ring-oscillator systems are described. Example systems may include multiple inverters, a phase detector module coupled to the multiple inverters, and a control module coupled to the phase detector module. The inverters may be configured to receive an external signal with an injection frequency and to output an oscillation signal. The phase detector module may be configured to detect a first phase signal, formed from a coupling of a natural frequency of the system and the injection frequency, from a first inverter in the multiple inverters and to detect a second phase signal, formed from the coupling of the natural frequency of the system and the injection frequency from a second inverter in the multiple inverters. The phase detector module may also be configured to determine a mean quadrature error (MQE) from at least the first phase signal and the second phase signal. The control module may be configured to generate a control signal from the determined MQE and adjust a supply voltage to at least one of the multiple inverters based on the control signal.

According to some embodiments, the multiple inverters may be configured to receive the external signal at an input terminal of the first inverter. The control module may include a low-pass filter and may be configured to generate the control signal from the determined MQE by use of the low-pass filter. The low-pass filter may include a charge pump. The control module may be configured to adjust the supply voltage so as to reduce a magnitude of the MQE.

According to other embodiments, the control module may be configured to increase a magnitude of the control signal in response to the determined MQE being greater than zero and decrease the magnitude of the control signal in response to the determined MQE being less than zero. The supply voltage may include the control signal, and the multiple inverters may be configured to implement a quadrature ring oscillator.

According to further examples, a clock signal distribution circuit is provided. The circuit may include a clock signal injection state, a ring oscillator with a natural frequency and coupled to the clock signal injection stage, a quadrature phase detector module coupled to the ring oscillator, and a low-pass filter module coupled to the ring oscillator and the quadrature phase detector module. The clock signal injection stage may be configured to receive a clock signal and use the clock signal to output an injection signal with an injection frequency. The ring oscillator may be configured to receive the injection signal and output multiple oscillation signals. The quadrature phase detector module may be configured to detect, from the ring oscillator, multiple phase signals formed from the coupling of the natural frequency and the injection frequency, and determine a mean quadrature error (MQE) from the multiple phase signals. The low-pass filter module may be configured to generate a control signal from the determined MQE and provide the control signal to the ring oscillator.

According to some embodiments, the clock signal may include an optical signal, the injection signal may include an electrical signal, and the clock signal injection stage may be further configured to convert the optical signal into the electrical signal. The low-pass filter module may include a charge pump, and/or may be configured to provide the control signal to the ring oscillator so as to reduce a magnitude of the MQE. The low-pass filter module may be configured to increase a magnitude of the control signal in response to the determined MQE being greater than zero and decrease the magnitude of the control signal in response to the determined MQE being less than zero.

According to other embodiments, the low-pass filter module may be configured to provide the control signal to the ring oscillator as a supply voltage equivalent to the control signal. The clock signal injection stage, the ring oscillator, the quadrature phase detector module, and the low-pass filter module may be configured to operate in a differential manner. The multiple oscillation signal may include quadrature signals to be distributed to data processor blocks.

Various embodiments may be implemented in hardware, software, or combination of both hardware and software (or other computer-readable instructions stored on a non-transitory computer-readable storage medium and executable by one or more processors); the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via application specific integrated circuits (ASICs), field programmable gate arrays (FPGAs), digital signal processors (DSPs), or other integrated formats. However, some aspects of the embodiments disclosed herein, in whole or in part, may be equivalently implemented in integrated circuits, as one or more computer programs executing on one or more computers (e.g., as one or more programs executing on one or more computer systems), as one or more programs executing on one or more processors (e.g., as one or more programs executing on one or more microprocessors), as firmware, or as virtually any combination thereof, and designing the circuitry and/or writing the code for the software and/or firmware are possible in light of this disclosure.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled. Also, the terminology used herein is for the purpose of describing particular embodiments only, and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a compact disc (CD), a digital versatile disk (DVD), a digital tape, a computer memory, a solid state drive, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. A data processing system may include one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., control motors to move and/or adjust components and/or quantities).

A data processing system may be implemented utilizing any suitable commercially available components, such as those found in data computing/communication and/or network computing/communication systems. The herein described subject matter sometimes illustrates different components contained within, or connected with, different other components. Such depicted architectures are merely exemplary, and in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present.

For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g.,"a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A method to injection-lock a ring oscillator having a plurality of inverters and a natural frequency, the method comprising:
    injecting an external signal with an injection frequency into the plurality of inverters;

detecting a first phase signal, formed from a coupling of the natural frequency and the injection frequency, from a first inverter in the plurality of inverters;

detecting a second phase signal, formed from the coupling of the natural frequency and the injection frequency, from a second inverter in the plurality of inverters;

determining a mean quadrature error (MQE) from at least the first phase signal and the second phase signal;

generating a control signal from the determined MQE; and adjusting the natural frequency of the ring oscillator based on the control signal.

2. The method of claim 1, wherein injecting the external signal comprises injecting the external signal into an input terminal of the first inverter.

3. The method of claim 1, wherein generating the control signal comprises generating the control signal from the MQE by use of a low-pass filter.

4. The method of claim 1, wherein adjusting the natural frequency of the ring oscillator comprises adjusting the natural frequency so as to reduce a magnitude of the MQE.

5. The method of claim 4, wherein adjusting the natural frequency of the ring oscillator further comprises increasing the natural frequency in response to the determined MQE being greater than zero and decreasing the natural frequency in response to the determined MQE being less than zero.

6. The method of claim 1, wherein adjusting the natural frequency of the ring oscillator comprises adjusting the natural frequency using adjustment of a supply voltage to at least one of the plurality of inverters based on the control signal.

7. The method of claim 6, further comprising using the control signal as the supply voltage.

8. An injection-locked ring oscillator system comprising:
a plurality of inverters configured to receive an external signal with an injection frequency and to output an oscillation signal;
a phase detector module coupled to the plurality of inverters and configured to:
detect a first phase signal, formed from a coupling of a natural frequency of the system and the injection frequency, from a first inverter in the plurality of inverters;
detect a second phase signal, formed from the coupling of the natural frequency and the injection frequency, from a second inverter in the plurality of inverters; and
determine a mean quadrature error (MQE) from at least the first phase signal and the second phase signal; and
a control module coupled to the phase detector module and configured to:
generate a control signal from the determined MQE; and
adjust a supply voltage to at least one of the plurality of inverters based on the control signal.

9. The system of claim 8, wherein the plurality of inverters is configured to receive the external signal at an input terminal of the first inverter.

10. The system of claim 8, wherein the control module comprises a low-pass filter and is configured to generate the control signal from the determined MQE by use of the low-pass filter.

11. The system of claim 8, wherein the low-pass filter comprises a charge pump.

12. The system of claim 8, wherein the control module is configured to adjust the supply voltage so as to reduce a magnitude of the MQE.

13. The system of claim 12, wherein the control module is configured to:
increase a magnitude of the control signal in response to the determined MQE being greater than zero; and
decrease the magnitude of the control signal in response to the determined MQE being less than zero.

14. The system of claim 8, wherein the supply voltage includes the control signal.

15. The system of claim 8, wherein the plurality of inverters is configured to implement a quadrature ring oscillator.

16. A clock signal distribution circuit comprising:
a clock signal injection stage configured to:
receive a clock signal; and
use the clock signal to output an injection signal with an injection frequency;
a ring oscillator with a natural frequency and coupled to the clock signal injection stage, and configured to receive the injection signal and output a plurality of oscillation signals;
a quadrature phase detector module coupled to the ring oscillator and configured to:
detect, from the ring oscillator, a plurality of phase signals formed from the coupling of the natural frequency and the injection frequency; and
determine a mean quadrature error (MQE) from the plurality of phase signals; and
a low-pass filter module coupled to the ring oscillator and the quadrature phase detector module and configured to:
generate a control signal from the determined MQE; and
provide the control signal to the ring oscillator.

17. The circuit of claim 16, wherein the clock signal includes an optical signal, the injection signal includes an electrical signal, and the clock signal injection stage is further configured to convert the optical signal into the electrical signal.

18. The circuit of claim 16, wherein the low-pass filter module comprises a charge pump.

19. The circuit of claim 16, wherein the low-pass filter module is configured to provide the control signal to the ring oscillator so as to reduce a magnitude of the MQE.

20. The circuit of claim 16, wherein the low-pass filter module is configured to:
increase a magnitude of the control signal in response to the determined MQE being greater than zero; and
decrease the magnitude of the control signal in response to the determined MQE being less than zero.

21. The circuit of claim 16, wherein the low-pass filter module is configured to provide the control signal to the ring oscillator as a supply voltage equivalent to the control signal.

22. The circuit of claim 16, wherein the clock signal injection stage, the ring oscillator, the quadrature phase detector module, and the low-pass filter module are configured to operate in a differential manner.

23. The circuit of claim 16, wherein the plurality of oscillation signals include quadrature signals to be distributed to data processor blocks.

* * * * *